United States Patent
Liaw

(10) Patent No.: US 9,036,404 B2
(45) Date of Patent: May 19, 2015

(54) METHODS AND APPARATUS FOR SRAM CELL STRUCTURE

(75) Inventor: Jhon-Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 544 days.

(21) Appl. No.: 13/436,149

(22) Filed: Mar. 30, 2012

(65) Prior Publication Data

US 2013/0258759 A1    Oct. 3, 2013

(51) Int. Cl.
| | |
|---|---|
| *G11C 11/00* | (2006.01) |
| *G06F 17/50* | (2006.01) |
| *G11C 11/412* | (2006.01) |
| *H01L 27/02* | (2006.01) |
| *H01L 27/11* | (2006.01) |

(52) U.S. Cl.
CPC .......... *G06F 17/5072* (2013.01); *G11C 11/412* (2013.01); *H01L 27/0207* (2013.01); *H01L 27/1104* (2013.01); *G06F 17/5077* (2013.01)

(58) Field of Classification Search
CPC .... G11C 11/412; G11C 11/413; G11C 15/04; G11C 8/16; G11C 29/83; H01L 27/0207
USPC ............ 365/63, 154, 156, 230.05, 49.11, 365/189.011, 189.15, 189.05, 202, 207; 257/206, 208, 211, E27.098, E27.099, 257/E27.1, E21.661, 903
See application file for complete search history.

(56) References Cited

U.S. PATENT DOCUMENTS

| | | | | |
|---|---|---|---|---|
| 6,535,453 | B2 * | 3/2003 | Nii et al. ................ | 365/156 |
| 6,693,820 | B2 * | 2/2004 | Nii et al. ................ | 365/156 |
| 6,812,574 | B2 * | 11/2004 | Tomita et al. ........... | 257/773 |
| 6,977,837 | B2 * | 12/2005 | Watanabe et al. ........ | 365/156 |
| 7,326,396 | B2 * | 2/2008 | Yu et al. ............. | 423/445 R |
| 8,830,732 | B2 * | 9/2014 | Liaw .................... | 365/156 |
| 2010/0213514 | A1 | 8/2010 | Liaw | |

FOREIGN PATENT DOCUMENTS

TW           201032324          9/2010

OTHER PUBLICATIONS

Shin, Changhwan, "Advanced MOSFET Designs and Implications for SRAM Scaling," Ph.D. Thesis, University of California, Berkeley, Spring 2011.

* cited by examiner

*Primary Examiner* — Hien Nguyen
(74) *Attorney, Agent, or Firm* — Slater & Matsil, L.L.P.

(57) ABSTRACT

An SRAM cell structure. In one embodiment, a bit cell first level contacts formed at a first and a second CVdd node, a first and a second CVss node, at a bit line node, at a bit line bar node, at a data node and at a data bar node; and second level contacts formed on each of the first level contacts at the first and second CVdd nodes, the first and second CVss nodes, the bit line node and the bit line bar node; wherein the first level contacts formed at the data node and the data bar node do not have a second level contact formed thereon. In another embodiment, a word line is formed and bit lines and a CVdd and a CVss line are formed overlying the SRAM cell and coupled to the corresponding ones of the nodes. Methods are disclosed for forming the cell structure.

20 Claims, 12 Drawing Sheets

METHODS AND APPARATUS FOR SRAM CELL STRUCTURE

TECHNICAL FIELD

The present invention relates to an SRAM cell structure and methods for providing an SRAM cell structure with improved connectivity and layout for advanced semiconductor processes.

BACKGROUND

A current common requirement for an electronic circuit and particularly for electronic circuits manufactured as integrated circuits in semiconductor processes is an array of memory storage elements. These elements may be provided as static random access memory cells (SRAM) cells to form SRAM memories. SRAM memory cells are described as "volatile" memory, because if the power to the integrated circuit device including the SRAM cells is removed, the stored data will be lost. Each bit cell in an SRAM array is a latch formed of typically six transistors (6T) or more such as 8T or 10T cells. Due to the reinforcing operation of the latch circuits, the SRAM cells will retain stored data so long as a sufficient supply voltage is present. SRAM memory arrays also have fast cell access times, making SRAM memories particularly attractive as scratchpad storage, or working data storage, such as in cache memory for processors. Recent system on a chip (SOC) designs often incorporate one or more "cores" with SRAM memory. These cores are often predesigned popular processors such as DSPs, ARMs, RISC, microcontrollers, or microprocessors. For example the processor cores may be arranged with a level one (L1) cache memory of SRAM cells laid out near or adjacent to the processor on a semiconductor substrate, to make very fast processing operations possible.

Increasingly, integrated circuits are used in battery operated and portable devices. For example, SOCs may be used to provide all or most of the circuitry needed to implement the main functions of a cellphone, laptop computer, netbook computer, tablet computer, audio or video player, camcorder or camera, smartphone or PDA, or GPS device. SRAM arrays are often combined with a processor and user logic to provide these functions in a single integrated circuit, in a stacked die packaged as a single device, or in a stacked wafer package, or in a package-on-package (PoP) device. Use of these highly integrated devices increases the system board area available and reduces the design and engineering development time needed to create new devices.

In an SRAM cell, data is stored on two storage nodes which are inversely related, which are referred to herein as the cell "data node" and the "data bar node". The storage portion of the SRAM cell may be formed from four MOS transistors, arranged as a latch circuit of two cross coupled inverters, each storage node being formed at the gate terminals of two MOS transistors and receiving the output of an inverter formed of the other two MOS transistors. Typically the circuit is implemented in complementary MOS (CMOS) technology. A pass gate coupled as a transfer gate provides an input and output path for a data on a bit line, and data on a complementary bit line bar, to be written to the data node and the data node bar, respectively. Read data is passed from the data node, and the data node bar, to the corresponding bit lines. The bit lines are coupled to the data nodes by an active voltage on a word line coupled to the gate terminals on the two pass gates.

Current semiconductor processes continue to shrink the features of the SRAM cells which leads to increased contact resistance, reduced contact hole size, and reduced tolerances in the photolithography used to form the SRAM structures. In addition, multiple patterning steps are required in the photolithography processing to form the SRAM cell structures, which increases costs and lowers throughput of the manufacturing processes.

BRIEF DESCRIPTION OF THE FIGURES

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
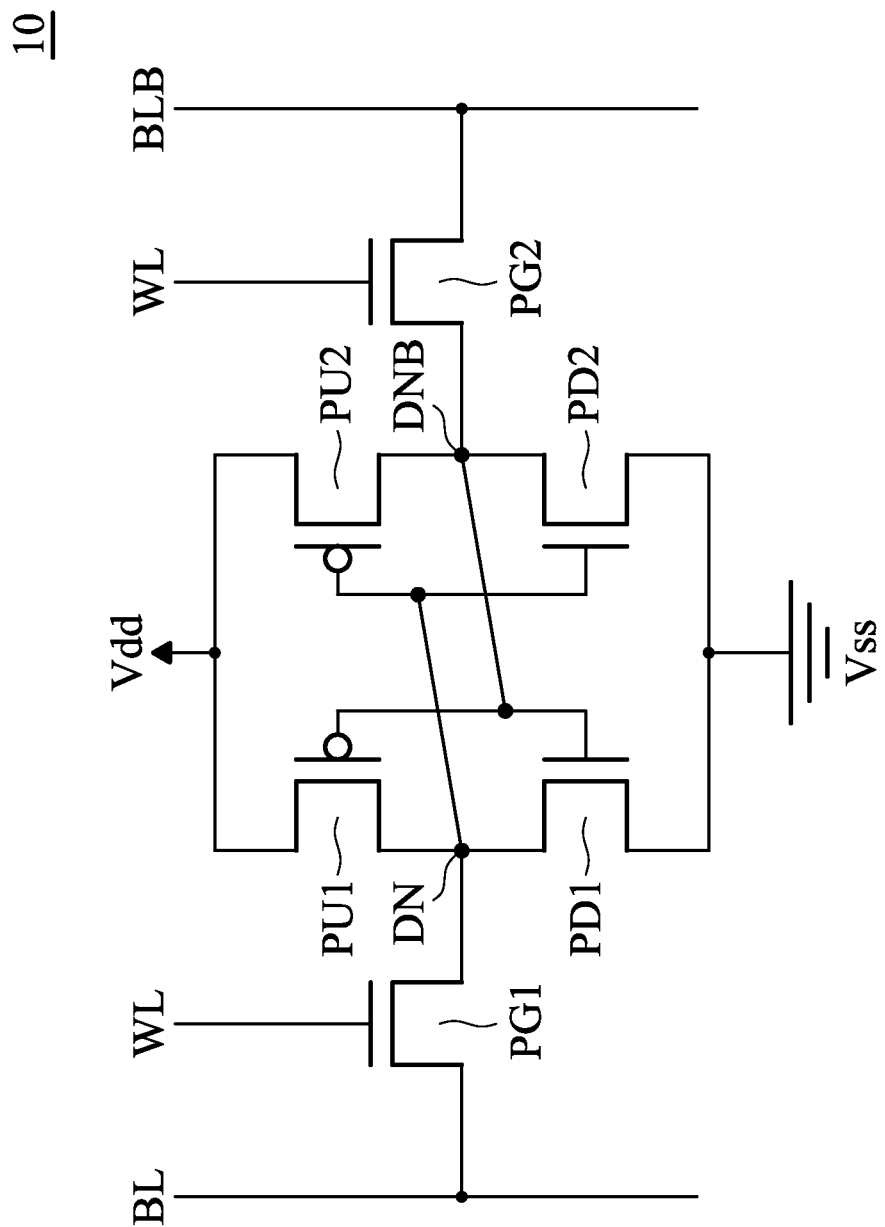
FIG. 1 illustrates a conventional SRAM bit cell circuit in a 6T cell arrangement.

FIG. 1 depicts as a non-limiting example, a typical SRAM bit cell 10 in a 6T arrangement. In FIG. 1, a pair of MOS pass gates labeled PG1 and PG2 couple a pair bit lines BL and BLB to the data nodes labeled DN and DNB, respectively. The pass gate transistors PG1 and PG2 are typically formed of MOS transistors arranged as transfer gates as is known in the art. In this example the transistors PG1 and PG2 are implemented as NMOS transistors. A positive supply voltage Vdd, which may be from 0.3 Volts to 3.0 or more volts, depending on the process technology, is shown. Pull up transistors PU1 and PU2 are formed of PMOS transistors and couple the positive supply Vdd to one or the other data nodes, depending on the state of the SRAM cell 10. A second supply voltage Vss, usually placed at ground, is shown and is coupled to the data nodes by the pull down transistors PD1 and PD2.

The two pull down transistors PD1 and PD2, which are also NMOS transistors in this non-limiting example circuit, couple this negative or ground voltage Vss to one or the other storage node labeled DN and DNB, depending on the state of data stored in the bit cell. The SRAM bit cell 10 is a latch that will retain its data state indefinitely, so long as the supplied power is sufficient to operate the circuit correctly. Two CMOS inverters, one formed of PU1, PD1 and one formed of PU2, PD2, respectively, are "cross coupled" and they operate to reinforce the stored charge on the storage nodes DN and DNB continuously. The two storage nodes DN and DNB are inverted one from the other. When DN is a logical "1", usually a high voltage, DNB is at the same time a logical "0", usually a low voltage, and vice versa.

When SRAM cell 10 is written to, complementary write data signals are placed on the bit line pair BL and BLB. A positive control signal on a wordline WL is coupled to the gate of both pass gates PG1 and PG2. The transistors PU1, PD1 and PU2, PD2 and the pass gates PG1 and PG2 are sized such that the write data on the bit lines may overwrite the stored data at nodes DN and DNB, and thus write the SRAM bit cell 10 to a desired state.

When the SRAM bit cell 10 is read from, a positive voltage is placed on the word line WL, and the pass gates PG1 and PG2 allow the bit lines BL and BLB to be coupled to, and receive the data from, the storage nodes DN and DNB. Unlike a dynamic memory or DRAM cell, the SRAM bit cell does not lose its stored state during a read, so no data "write back" operation is required after a read.

The bit lines BL and BLB form a complementary pair of data lines. As is known to those skilled in the art, these paired data lines may be coupled to a differential sense amplifier (not shown); and the differential voltage read from SRAM cells can be sensed and amplified, as is known in the art. This amplified sensed signal, which is at a logic level voltage, may then be output as read data to other logic circuitry in the device.

In forming the SRAM cell of FIG. 1 on a semiconductor device, a structure is formed in three dimensions. In a semiconductor device, transistors may be formed as planar devices in the substrate. Alternatively the transistors may be formed in an epitaxial layer over the substrate or over an insulator. Using dopants and diffusion processes, source and drain regions may be formed. Common areas of the circuit, such as the drains of the storage transistors PD1 and pass gate transistor PG1, storage transistor PD2 and pass gate PG2 in FIG. 1, may be formed together to increase packing density in the circuit layout. Gate regions may be formed over gate dielectric material; typically the gate will overlie a channel area between the source and drain regions. In finFET transistors, which are increasingly used, the fin may include the source and drain regions, and the gate may be an overlying gate electrode that is formed to intersect the fin. The gate may be formed of a doped polysilicon, for example, or a metal gate may be used.

After the transistors are formed, the devices may be interconnected to form circuits. These connections may be formed using horizontal conductors formed of metal layers that are separated from the substrate and the gate by dielectric layers. Further the metal layers are separated and electrically isolated from one another by interlevel dielectric layers (ILD) and intermetal dielectric layers (IMD). These dielectric layers may be low-k or high-k dielectric materials, for example.

Of course this non-limiting embodiment may be further extended to an 8T SRAM bit cell, a 10T SRAM bit cell, and to content addressable memory (CAM) bit cells. The 6T SRAM bit cell of FIG. 1 is used for illustration and to explain the features, but does not limit the embodiments or the appended claims.

The connections between metal layers needed to couple the device nodes, such as the data storage nodes, or the bit line nodes, to the overlying conductors, are made vertically through the dielectric layers. Example connections are shown in FIG. 2.

Figure 2:
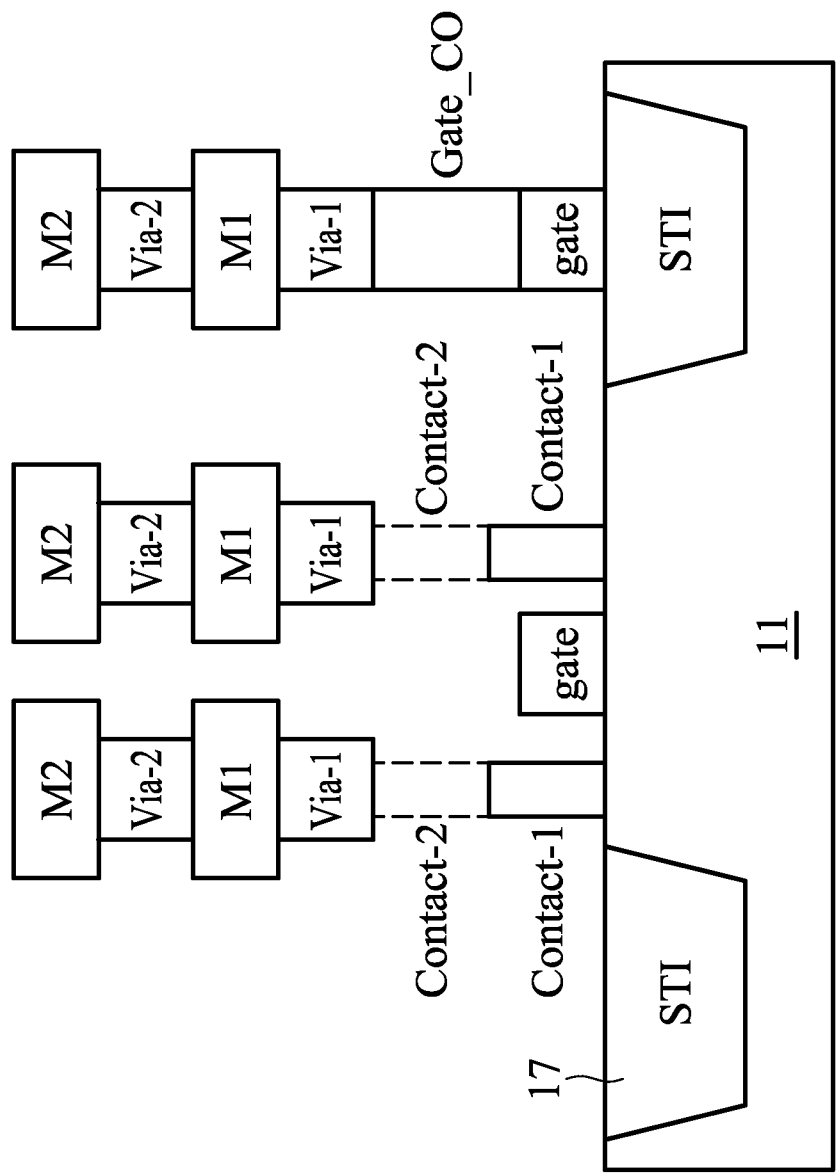
FIG. 2 illustrates in a cross-sectional view the vertical connections including vias and contacts for use with the embodiments.

FIG. 2 depicts various connections that may be made between the conductive layers to the active regions such as source and drain regions, and to the gate conductors. In FIG. 2, a substrate 11 is shown in cross-section. This substrate may be a portion of a semiconductor wafer. Alternatives for substrate 11 may include a layer of semiconductor material over an insulator (SOI). This layer may be formed by epitaxial growth. The semiconductor layer 11 may be silicon, but other alternatives such as germanium, silicon germanium, and gallium arsenide may be used. Examples include, without limiting the embodiments, bulk silicon, SiP, SiGe, SiC, SiPC, germanium, silicon on insulator (SOI—Si), silicon-germanium on insulator (SOI—SiGe), or combinations of these.

Isolation regions 17 are shown defining an active area. The isolation regions may be insulating regions extending into the substrate such as shallow trench isolation (STI) regions. Alternative isolation regions include local oxidation of silicon (LOCOS).

A vertical connection to an active region, such as a source or drain region in the substrate is referred to as a "contact". The contact is an opening formed in a dielectric layer overlying the substrate or fin that is then filled with conductive material. The contacts may be formed from various conductors including, without limitation, metal nitrides, Cu, W, Al, AlCU, TiN, TiW, Ti, TaN, Ta, Pt, or combinations. Note that in FIG. 2, the dielectric layers have been omitted for clarity. These dielectric layers may be formed of various insulators used in semiconductor processing including silicon oxide, silicon nitride, silicon oxynitride, and others. High-k and low-k dielectrics may be used. Multiple layer dielectrics may be used. Carbon containing dielectrics may be used. The gate dielectric material used may include silicon dioxide (SiO2, or "oxide"); silicon oxynitride (SiON), silicon nitride (Si3N4, or "nitride"); Ta2O5, Al2O3, PEOX, TEOS, nitrogen containing oxide layers, nitride oxide, Hf containing oxide layers, Ta containing oxide, Al containing oxides, high-K dielectrics with a dielectric constant K>3.8, or more preferably >10, or a combination.

In FIG. 2, gate conductors are shown. These may be gate electrodes and may include doped polysilicon over a gate dielectric (not shown for simplicity). The gate conductors may also have sidewalls which are typically formed of silicon oxides and silicon nitrides. Silicide may be formed over the gate material and over the source and drain regions to reduce resistance and improve performance. Gate electrodes used with the embodiments may be formed, as non-limiting examples, from polysilicon gate over silicon oxynitride dielectric, metal gate over a high-K gate dielectric, silicide over metal gates over a high-K gate dielectric material, or a combination.

The first layer of contact materials in FIG. 2, the layer that provides a path to the substrate, is labeled Contact-1. Contact-1 may be formed of dielectric openings filled with conductive material as described above. Plugs such as tungsten (W), for example, may be used as the conductive material.

As semiconductor processes advance, the contact openings shrink with the overall shrink in process feature sizes, and the contact hole aspect ratio increases. That is, the opening in the contact hole continues to shrink, while the vertical height of the contact hole does not scale as quickly, so that the contact holes become high aspect ratio structures, with a height to width ratio greater than 5 for a 28 nanometer semiconductor process node. As the semiconductor processes advance to still smaller feature sizes, it becomes more difficult to correctly form these narrow structures in the dielectric material, and to keep them open, until the conductive plugs are formed. Recent approaches to improve the reliability and yield of contacts at advanced process nodes include the use of two level contacts. In this approach, two levels of contacts are formed by patterning and etching two holes to form the vertical contacts. This concept is illustrated in FIG. 2 by showing the second level as Contact-2. Contacts at the Contact-2 level are formed above and in physical contact with and in substantial alignment with the Contact 1 layer. However, when conductive paths are needed to the gate electrode, the contact is referred to as a gate contact, labeled Gate_CO in the figure. The gate contact material may be different from the material in Contact-2, although it could be the same. The gate contact Gate_CO may also extend deeper than Contact-2, in some processes, to make physical and electrical contact to the top surface of the gate conductors. The Gate_CO contacts may be shaped as round, elliptical, rectangular, and square or other shapes. Gate contacts may form "butted" contacts in which the gate contact overlies a gate electrode, and a proximate first level contact to form a local interconnection.

The remaining connections are shown in FIG. 2 as metal layers in a conductor trench and via arrangement. The first layer of conductor, which may be a metal conductor formed above the substrate, labeled "M1", is shown in cross-section in a trench arrangement. Copper, aluminum and alloys of these may be used. Without limitation, the metal layers may include barrier materials including diffusion barriers and antireflective coatings may be used. The vias that connect this horizontal conductor to structures below it are labeled "Via-1". These vias are openings or holes filled with conductor material. In some processes the vias may be formed with the conductors in a damascene process. Both dual damascene and single damascene processes may be used, and, both "via first" and "via last" via patterning methods may be used. The second conductor layer above the substrate, lying above and insulated from the metal 1 layer by dielectric material, is labeled "M2" for metal 2, in FIG. 2. When a vertical connection to a M1 layer is required from an M2 layer conductor, a "Via-2" layer via is formed. Thus for a connection from M2, the second metal layer, down to the substrate, a conductive path includes: a second level via, Via-2, at least a portion of a first level metal layer, M1, a first level via, Via-1, a second layer of contact, Contact-2, and first layer contact, Contact-1. To connect to a gate electrode, a gate contact Gate-CO is used instead of the second layer contact and no Contact-1 is used, as shown in FIG. 2.

As the process nodes used in semiconductor manufacture continue to shrink, the limits of the lithography equipment used are reached. For example, typical equipment uses a 193 nanometer photolithography tool. The smallest feature that is available from this tool may be 80-nanometers, for example. At advanced process nodes such as 20 nanometers, and lower, this feature size is not small enough to make the contacts patterns of Contact-1, for example. Recently additional process advances have required so-called multiple patterning. By using more than one photolithographic pattern for a feature at a given level, additional size reductions are possible. For the contacts in Contact-1, for example, two pattern and two etch (2P2E) may be used. Further advances in shrinking the minimum features of semiconductor nodes may require more levels of photolithography, such as 3P3E processing, to form the features. These approaches add significant costs and reduce throughput. Additional photomasks are needed, and for each level of patterning, alignment and other process variations must be carefully controlled.

In embodiments described herein, the use of two level contacts further reduces the contact aspect ratios. In the embodiments, the first level contacts may have a hole height to hole width (measured at the bottom of the contact hole) ratio of about 3, or less. The second level contacts in the embodiments may have a hole height to hole width (at the bottom of the contact hole) ratio of about 5, or less. Lowering the contact aspect ratio increases yield and reliability.

In an embodiment approach described below, an SRAM layout is provided where the contacts formed using the Contact-2 layer is arranged so that single patterning (1P1E) photolithographic processes may be used for the Contact-2 layers without the need for double patterning. In this manner significant cost savings may be attained. In another embodiment, the lithographic misalignment characteristics for existing 193 nanometer tools are used with double patterning (2P2E) to form contacts with an aggressive line end rule. In an example process, the spacing that can be attained using the two level patterning is about 10-20 nanometers. The use of this aggressive line end rule enables either a very compact SRAM cell or creates routing space for additional routing freedom within the SRAM cells.

Advanced semiconductor devices increasingly use finFET transistors. A finFET transistor has a two dimensional or three dimensional gate structure. By forming the gate electrode including a dielectric and a conductor over a vertical "fin", the width of the transistor gate, W, which is directly proportional to performance of the transistor, may be increased using the vertical height of the fin, without correspondingly increasing the surface area needed for the device. Put another way, for a given W/L measure, the finFET devices may be packed in a denser arrangement than conventional planar MOS devices having a corresponding W/L measure.

Figure 3:
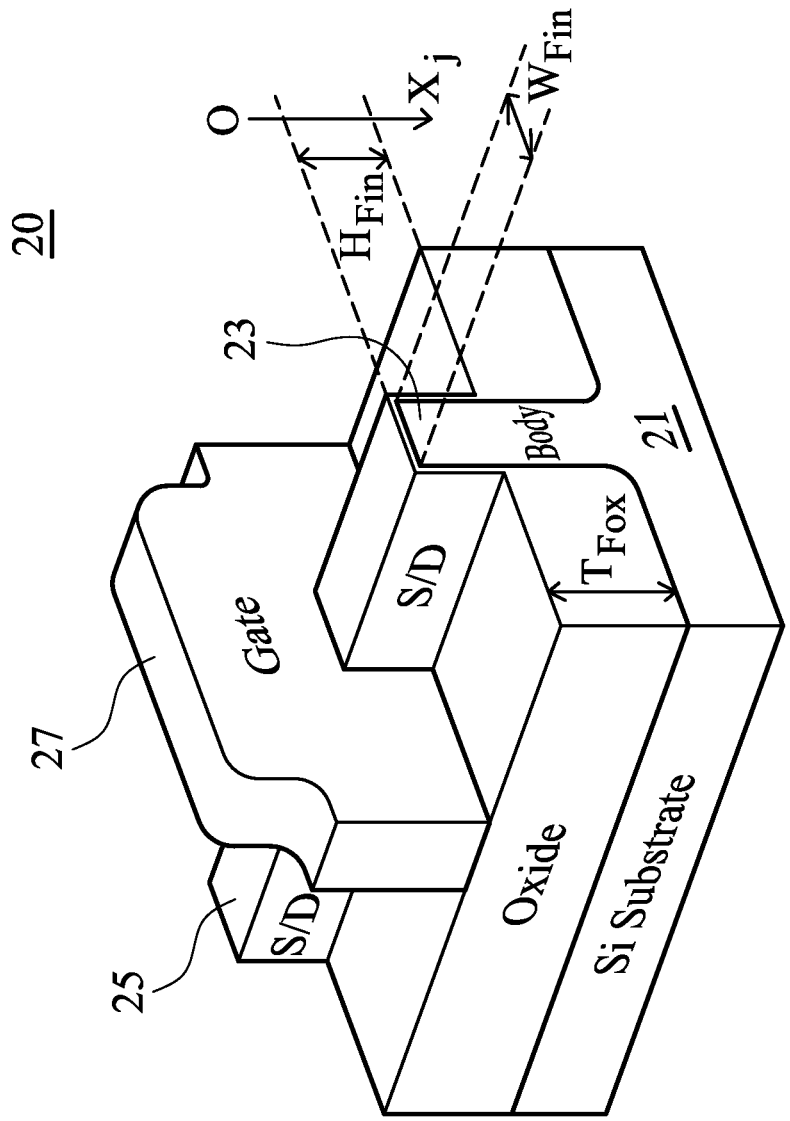
FIG. 3 illustrates a finFET transistor for use with the embodiments.

FIG. 3 depicts, in a simplified projection view, one finFET structure 20 that may be used with the embodiments. In FIG. 3, the body of a semiconductor substrate 21 is shown etched to form a vertical fin 23. This fin 23 may be selectively doped to form source/drain regions 25. Note for MOS devices, the source and drain regions are usually physically identical, and the choice of the term "source" and "drain" for a source/drain region depends on the circuit connections made after the transistor is formed. An oxide layer is formed to form a gate dielectric. The supply voltage is typically coupled to the "source" region, and the other terminal is then the "drain" for the transistor. After the source and drain regions are formed, a gate may be formed over the gate dielectric. In FIG. 3 the gate 27 is shown intersecting the fin 23 and overlying it.

The gate may be, for example, a polysilicon structure formed at a right angle or other angle to the longitudinal fin direction and where the gate overlies the fin, a channel region is formed within the fin. Thus a transistor is formed having a gate, source and drain region. The gate width W may be twice the height of the fin "Hfin", plus the width the fin "Wfin". As the fin gets taller, then, the transistor gate width W grows by twice the height Hfn. The length L of the transistor is the thickness of the gate conductor 27 across the fin. Thus the critical performance ratio W/L for the transistors may be increased by increasing the fin height, without correspondingly increasing the substrate area needed.

Because the surface of the top of the fin is also shrinking with advances in semiconductor processes, making electrical contact to the fin becomes an additional challenge for the Contact-1 layer in FIG. 2. As will be discussed more below, embodiments for SRAM cells provided in this application provide additional contact area to increase performance and to lower the contact resistance Rc.

Figure 4:
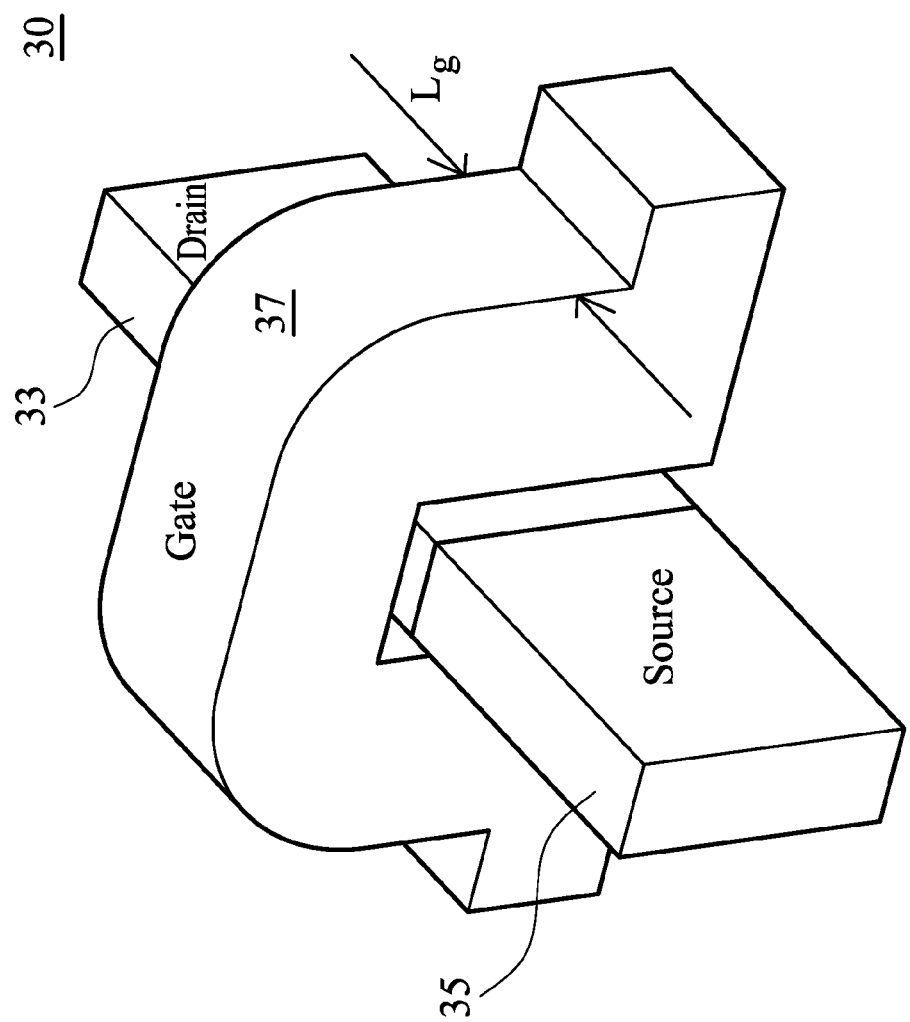
FIG. 4 illustrates another finFET transistor for use with the embodiments.

FIG. 4 depicts in another view a finFET device 30. FIG. 4 provides a finFET as an epitaxial layer over, for example, an insulator material (not shown). A fin has doped regions 35 and 33, which form the source and drain regions. A gate conductor 37 arranged in a normal direction to the fin, the gate conductor 37 intersects the fin at a channel region. As shown in FIG. 3 the length Lg of the gate is the width of the gate conductor 37. The width of the gate W is then again twice the fin height plus the width of the top of the fin. Increasing the fin height thus conveniently increases the W of the transistor. In some fin-FET devices, the dielectric layer is formed on the vertical sidewalls of the fin but not the top surface; these may be called "two dimensional" transistors. The concepts are generally similar for both types of finFETs.

Figure 5:
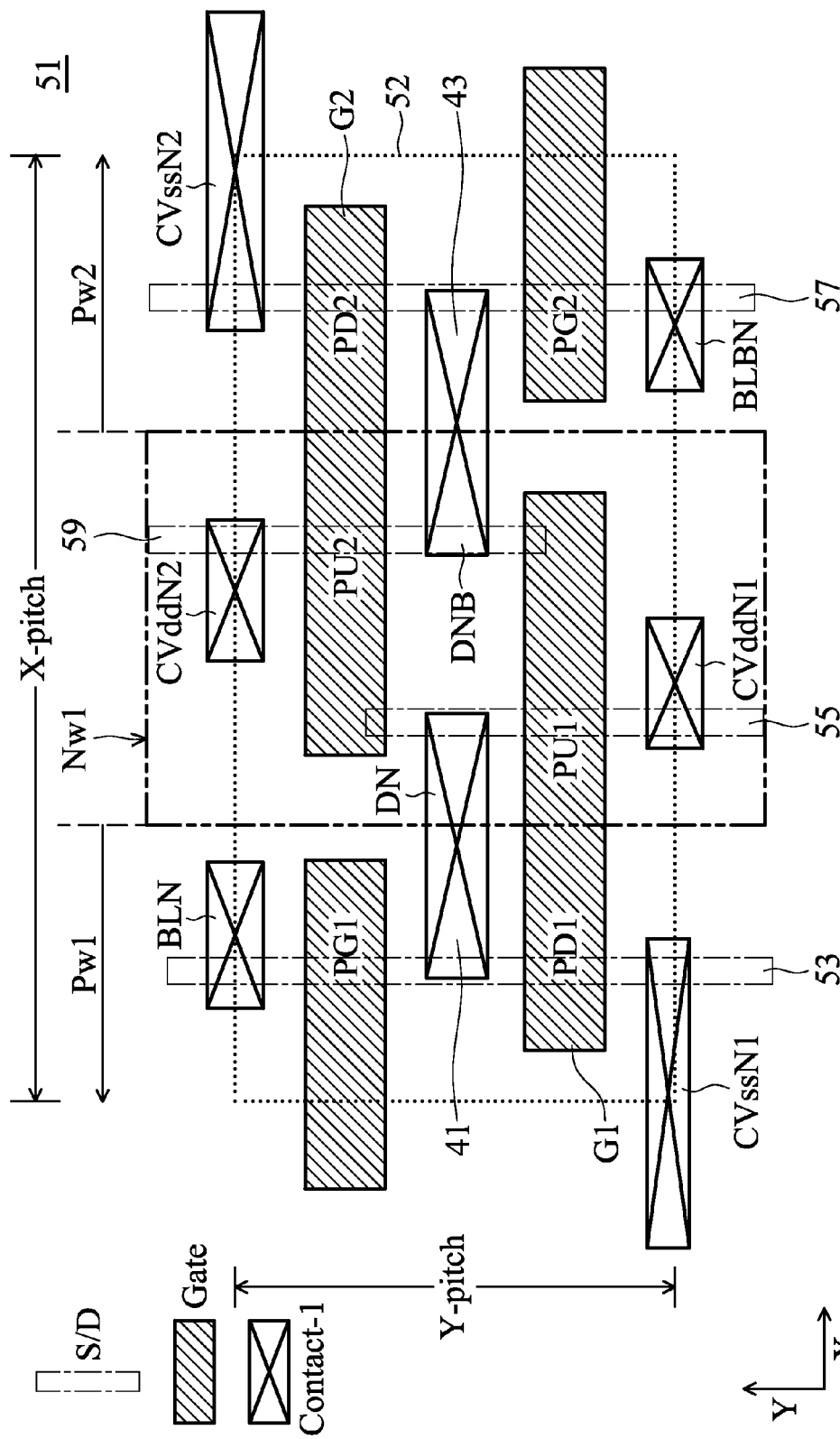
FIG. 5 illustrates in a plan view a layout for an example embodiment SRAM cell structure.

FIG. 5 depicts in a plan view a partial layout for an example SRAM cell circuit 51, using features of the embodiments. The SRAM cell 51 has a Y-pitch in the Y direction and an X-pitch in the X direction. In FIG. 5, the transistors of FIG. 1 are shown and are labeled PG1, PG2, for the pass gates, and PU1, PU2, for the PMOS pull up transistors, and PD1, PD2 for the NMOS pull down transistors. The nodes form FIG. 1 are also labeled, the data node DN and complementary data node DNB are show; also, nodes BLN and BLBN are shown, nodes where the bit line BL, and bit line complement BLB, connect to the source of the two pass gates PG1 and PG2.

The gate electrodes for the pass gates PG1, PG2 and the common gate electrode for the first inverter including pull-up device PU1 and pull-down device PD1, G1, and the common gate electrode for the second inverter including pull-up device PU2 and pull-down device PD2, G2, are shown arranged in the X-direction.

The active regions including the source and drain regions for the transistors are shown as source/drain 53, 55, 57 and 59. As described above, these may be formed as fins for finFET devices. The fins may be formed of bulk semiconductor material, as in FIG. 3. Epitaxially grown material may be used as the fin, as in FIG. 4, or a fin may be created in the bulk semiconductor material. Alternatively, these active regions may be formed as source/drain diffusions in a planar MOS process.

The SRAM cell 51 has a cell boundary 52. Although not shown in this plan view, adjacent SRAM cells which have identical circuit functions to SRAM cell 51 may butt up against the SRAM cell 51. Also, the SRAM cell 51 will be part of an array of cells arranged in columns and rows, typically the cells are arranged along rows having word line conductors, with the bit lines running along the columns. In the array of cells, adjacent SRAM cells may be symmetrically arranged to increase packing density by using mirroring or flipping of the cell layouts, so that common features such as the bit line, bit line bar, and power supply connections may be shared between adjacent cells, further increasing the packing density of the cells for SRAM arrays formed with the cells.

A common gate G1 is shown for transistors PU1 and PD1, and G2 is a common gate for transistors PU2 and PD2. The gate electrodes for pass gates PG1 and PG2 are also shown. As can be seen from the circuit diagram in FIG. 1, these pass gates PG1 and PG2 will be coupled to a word line conductor by connections made in upper conductive layers, described below.

The PMOS transistors in the SRAM cell 51, which are typically the pull up transistors PU1 and PU2 as in the circuit diagram in FIG. 1 are formed in an N well region Nw1. Note for a planar MOS layout, the substrate may be doped to a certain conductivity type, for example, P-type, and then an N well Nw1 may be formed selectively where PMOS transistors are needed. However, both N and P wells could be formed, and as shown in the figure, two P wells Pw1 and Pw2 could be formed for an SRAM cell. Further, when finFET devices are used the fins may be formed of doped material of a first conductivity type, and the source and drain regions may be doped of the opposite conductivity type. These fins may lie over an insulator in a silicon on insulator (SOI) arrangement, for one example.

In FIG. 5, which is a partial layout view of SRAM cell 51, a key to the shading is provided. The layers shown are the source/drain material labeled S/D, the gate electrodes labeled Gate, and the first level contacts Contact-1. As described above with respect to FIG. 2, in order to contact the substrate or fins, a first level contact Contact-1 is formed. For example, in FIG. 5, first layer contacts are formed to provide connectivity as shown in the circuit diagram of FIG. 1 to the source terminals of the pull down transistors PD1 and PD2, these are labeled nodes CVssN1 and CvssN2; and these nodes will be coupled as described later to a ground voltage conductor CVss. The source terminals of the pull up transistors PU1 and PU2 are coupled to contacts labeled as nodes CVddN1 and CVddN2, as shown in the circuit diagram of FIG. 1; these nodes will be coupled to a positive voltages supply conductor CVdd. The source terminals of the pass gate transistors PG1 and PG2 are coupled to nodes labeled BLN and BLNB by first layer contacts, as shown in FIG. 1 these nodes will be coupled to conductors for the bit lines BL and BLB.

Within the central portion of the SRAM cell 51 as shown by the cell boundary 52, the common drains of transistors PD1 and PU1 are coupled together by a long first level contact, labeled DN for data node. This node DN is also coupled as a common drain to the pass gate PG1. The common drain terminals (see the circuit diagram of FIG. 1) for the transistors PU2 and PD2 are coupled together by the long first level contact labeled DNB for data node bar. The drain of the pass gate PG2 is also coupled to DNB.

For understanding of the arrangement of the SRAM cell 51 in an array, it is important to note that common areas may be combined with the same area in adjacent SRAM cells arranged so as to improve packing density. For example, the nodes CVddN2, CVssN2, and BLN, may have a single first layer contact (and the corresponding connections to upper layers) for two adjacent SRAM cells. This may be accomplished using layout symmetry and mirroring or flipping adjacent cells in position to optimize the common connections. The cell adjacent to SRAM cell 51 in an array of these cells can share these first level contact connections. Similarly, nodes CVssN1, CVddN1, and BLBN1 may be shared with an adjacent cell in an SRAM array. The fins, or source drain regions, 53, 55, 57, 59 may extend across SRAM cell boundaries to take advantage of common connections and further increase packing density.

In FIG. 5, the first level contacts are various sizes. To reduce the contact resistance and make layout compatible with shrinking processes, several approaches are used. The first level contacts are all arranged with a shorter width in the "Y" direction to provide compact cell size, but are lengthened along the "X" direction, in parallel with the gate routing for gates G1, G2 for example. The particular data node first level contacts arranged within the cell boundary 52, contacts 41 and 43, are lengthened more than other first level contacts, for example the bit line and bit line bar node contacts. The data node and data bar node contacts, 41 and 43, are at least about 2.5 times longer than they are wide, for example, and may be longer still. The contacts on the cell boundary 52, including the bit line and bit line bar node contacts, the CVddN1 and CVddN2 contacts, and the CVssN1 and CVssN2 contacts, are all shared with adjacent SRAM cells (not shown) which further increases cell density. The first level contacts for the Vss connections at nodes CVssN1 and CVssN2 are also lengthened, and may be at least about 3 times longer than they are wide. This provides additional routing freedom and lowered contact resistance.

Figure 6:
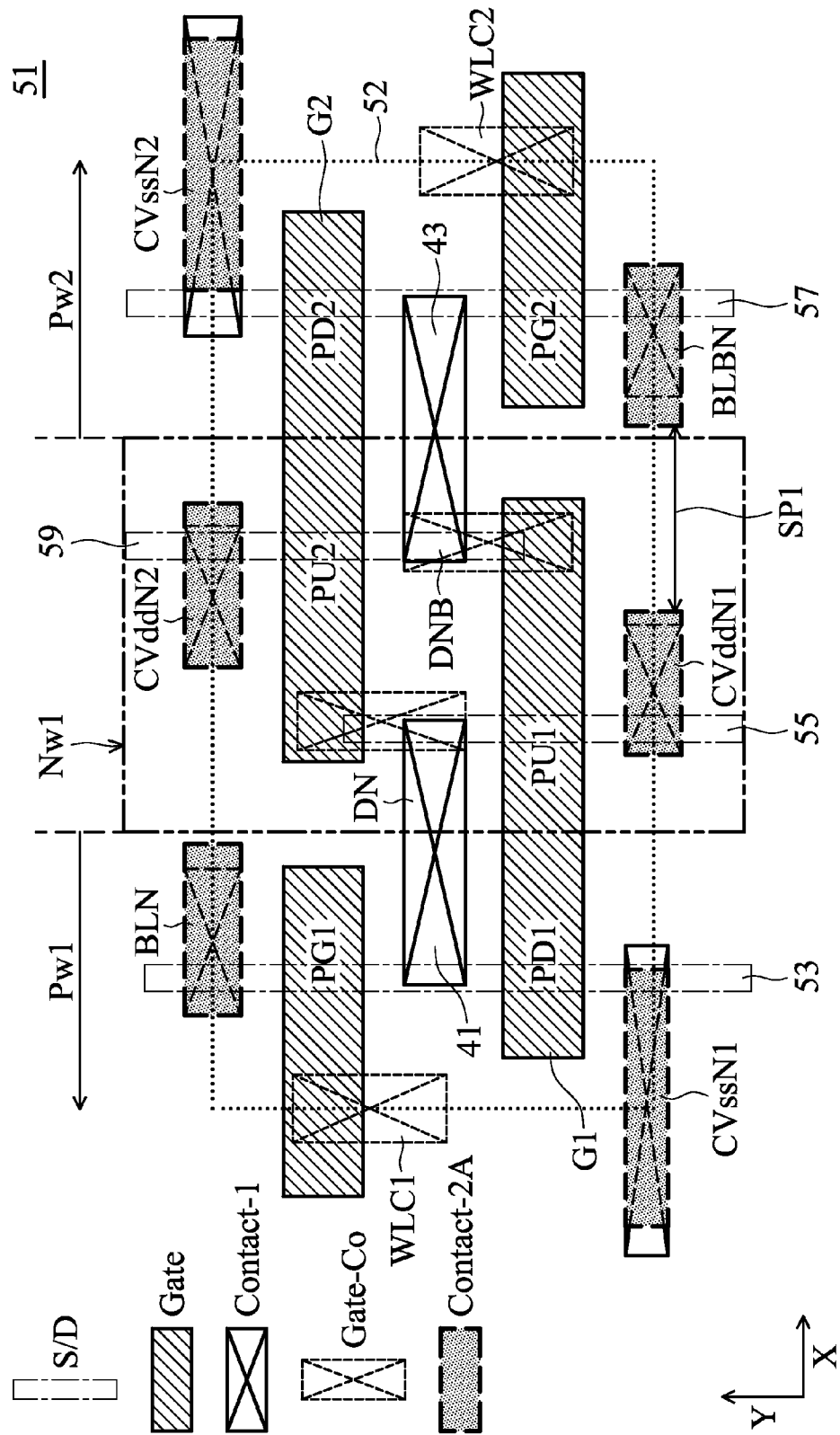
FIG. 6 illustrates in a plan view the layout of FIG. 5 showing additional features of an embodiment.

The layout of FIG. 5 is a partial view, presented to increase readability of the drawings. In FIG. 6, the features of FIG. 5 are again repeated and the second layer contacts and gate layer contacts are added, so that the vertical connection patterns for the SRAM cell structure may be seen. Most of the features of FIG. 5 are also shown in FIG. 6 and so the reference labels for these elements are repeated.

In FIG. 6, a plan view of SRAM cell 51 is shown now with the second level contact layers Contact-2A and gate contact layers Gate-CO, depicted. At the bit line and bit line bar nodes BL and BLB, a second layer contact is shown, indicated by the key as type Contact 2A. This Contact-2A layer is formed using single patterning photolithography. Single pattern photolithography such as 1P1E is less expensive than double patterning, but the spacing rules must reflect that the features that can be obtained are larger (more space required). The nodes CVddN1, CVssN1, CVddN2, CVssN2, are each also shown with a Contact 2A, that is, a second layer contact formed over the first layer contact. As shown in FIG. 2, in order to make vertical connections to the conductors, a first layer contact is coupled with a second layer contact, then, as described below, to a via. The second level contacts shown in this embodiment are all formed at the cell boundary 52, and, are all arranged along the X direction, parallel to the gate routing such as G1 and G2. The second level contacts Contact-2A in FIG. 6 are also generally the same size as or slightly smaller than, the underlying first level contacts. The second level contacts may be 0-5% smaller in area than the underlying first level contacts, for example.

In addition, gate level contacts Gate-CO are shown. These gate level contacts are formed at the two word line contact areas labeled WLC1 and WLC2 corresponding to the gate conductor connections to the pass gates PG1 and PG2. In addition, butted contacts, which form local interconnections, are shown coupling the first level contacts 41 and 43 at the nodes DN and DNB to the gate G2 of the inverter formed by PU2, and PD2, (node DN); and the gate G1 of the inverter formed by transistors PU1, and PD1, (node DNB). These butted contacts couple the gate conductors to the first level contacts, but as no further connections are needed, the central portion of the SRAM cell 51 is free of vias. The second layer contacts at layer Contact-2A are all formed at the cell boundary, which further aids layout density. These contacts may be shared with adjacent cells. The internal portions of the SRAM cell are free of the second level contacts formed at the Contact-2A layer, but do have four gate contacts in the Gate_CO layer, two at the nodes WLC1 and WLC2 coupled to the gates of the pass gates PG1 and PG2, and two butted contacts at the gate contact level between the first level contacts at nodes DN and DNB, and the gate electrodes G2 and G1. The gate level contacts Gate-CO may be formed using two level photolithography (2P2E) for example.

The use of a wider spacing for the line end spacing (labeled space SP1 as shown in FIG. 6) is a feature of the embodiments. While denser packing is possible, using a relaxed line end rule for the contact 2 to contact 2 end spacing as in this embodiment enables the use of the cheaper single patterning processes to form the second level contacts for the SRAM cell 51, without requiring a second level patterning step for the second level contacts. This simpler photolithographic process saves costs, and increases throughput by reducing mask levels and pattern and etch steps. The tradeoff is that the area in the SRAM cell 51 is increased slightly to accommodate a wider line end spacing rule. The same line end spacing rule is used between the nodes BLN and CVddN2, in the upper portion of the SRAM cell 51. As will be described further below, in alternative embodiments a different approach may be used which uses a more aggressive line end spacing rule may be used to reduce the area of SRAM cell 51, or alternatively, create additional routing area.

Figure 7:
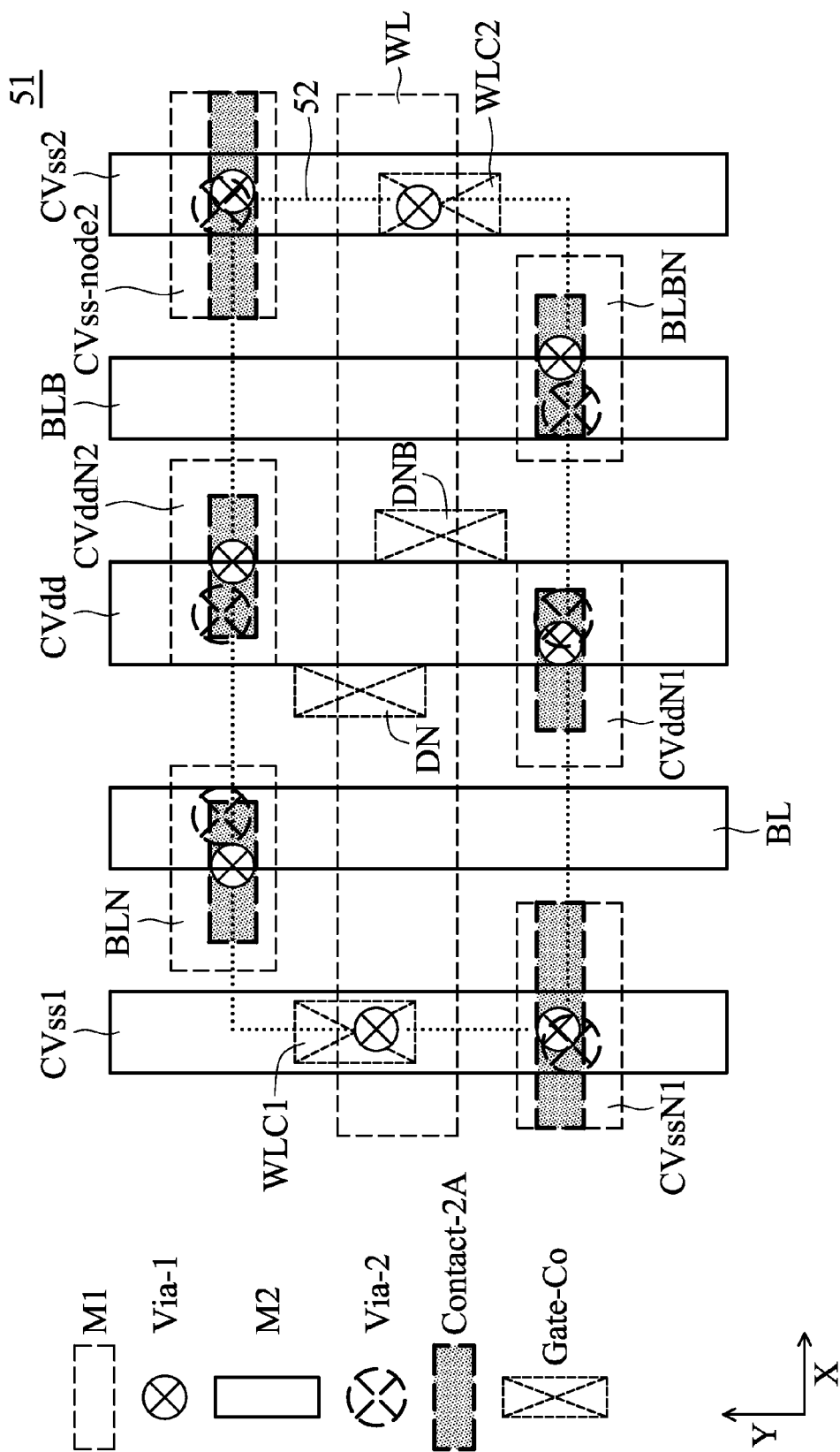
FIG. 7 illustrates in a plan view a layout for the SRAM cell structure of FIGS. 5 and 6, illustrating upper level connections for the embodiment.

FIG. 7 illustrates in a plan view the metallization, or "back end of the line", layers of SRAM cell 51. In FIG. 7, the gate contacts labeled Gate-Co and the second layer contacts labeled Contact-2A are again shown in the same locations as in FIG. 6, to aid in reading FIG. 7. The word line contacts WLC1 and WLC2 are shown with a first level via (labeled Via-1 in the shading key) providing vertical connectivity to the first level metal layer conductor at layer M1, which is coupled to the word line WL, arranged in the "X" direction in this non-limiting example. The butted gate level contacts at the data node DN and the data node DNB are shown to aid in visually locating the lower level connections and devices in the SRAM cell 51, these are shown in FIG. 6 for example. The second level metal M2 provides, in strips laid out in parallel and running in the "Y" direction, the voltage supply conductors CVss1, CVdd, and CVss2, and these are coupled to the nodes shown in FIGS. 5 and 6 by second level vias in layer Via-2, M1 layer "landing pads" provided to couple the Via-2 vias to lower levels, and vias at layer Via-1 to couple the contacts, which are Contact-2A layer contacts. By superimposing the metallization layers as shown in FIG. 7 over the lower layers depicted in FIG. 6, the layout of the SRAM cell 51 is completely illustrated.

Thus in this embodiment, by using a certain line end spacing rule in laying out the first and second level contacts, and by creating sufficient space that single patterning can be used to pattern the second level contacts in the SRAM cell 51, the cell may be manufactured at advanced semiconductor process nodes, such as below 28 nanometers, including 22 nanometers, 20 nanometers, and 14 nanometers, and beyond, using existing photolithographic tools with the corresponding limits on lithography and feature sizes; and thus produced at a lowered cost.

Figure 8:
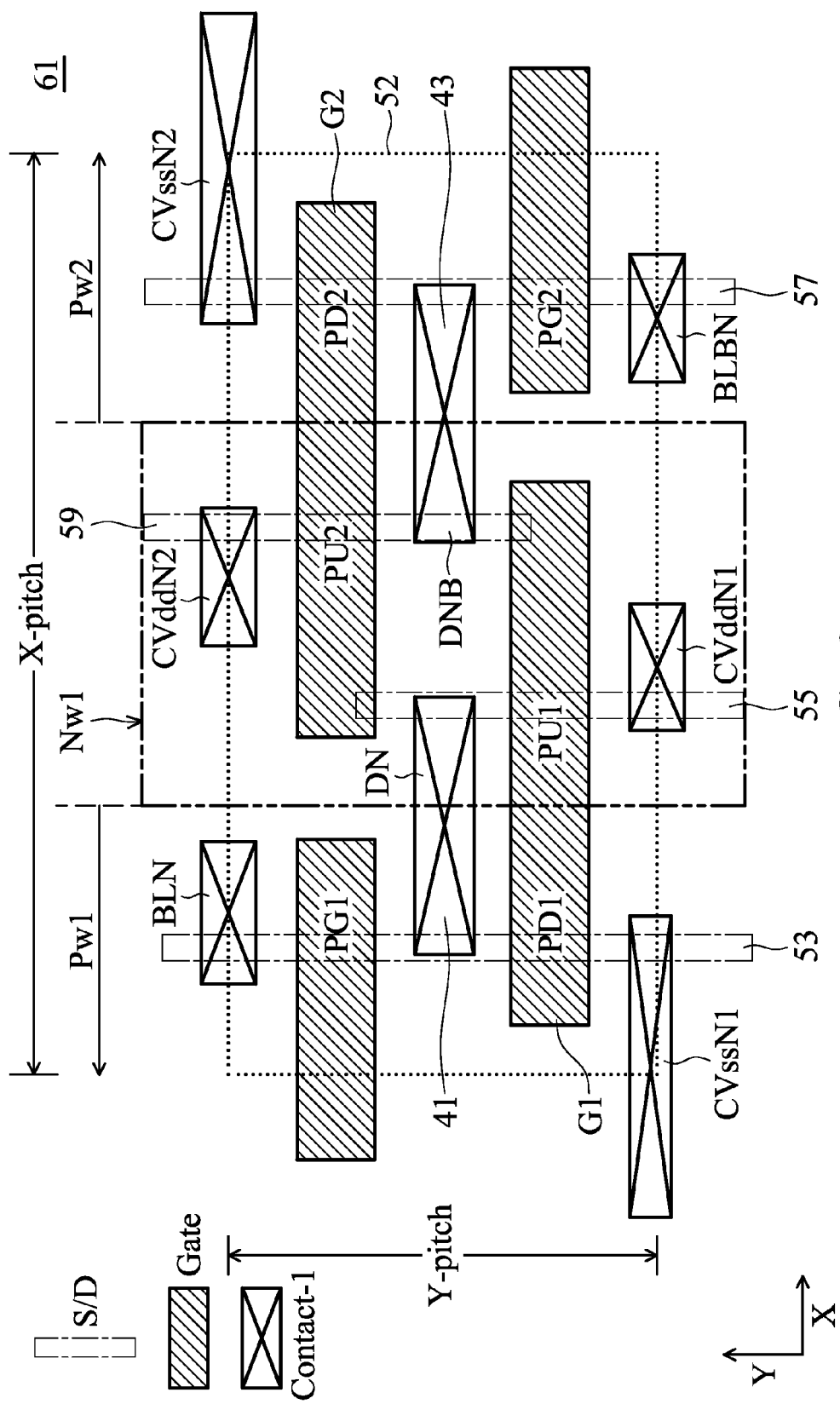
FIG. 8 illustrates in a plan view a layout for an alternative embodiment SRAM cell structure.

FIG. 8 illustrates, in a plan view, a partial layout for an alternative embodiment for an SRAM cell, 61. The layout of SRAM cell 61 is different from the layout shown in FIGS. 5-7 in several respects, however, the example circuit implemented is again the example 6T SRAM cell shown in FIG. 1. Many elements are the same as in FIG. 5, for example, and like reference labels and numerals are used for like elements.

For ease in understanding the figures, FIG. 8 illustrates the layers up to the first level contact layer, Contact-1, and in later figures additional features are shown. In FIG. 8, the gates for transistors PU1, PD1, and PU2, PD2 are again shown where the source drain fin or active regions intersects the gate electrodes G1 and G2, respectively. The internal data nodes of the cross coupled latch formed of these four transistors are again labeled DN and DNB. The pass gates PG1 and PG2 are again labeled and these transistors couple a bit line node BLN and a bit line bar node BLBN, respectively, to the data nodes DN and DNB. A first level contact at layer Contact-1 located at DN couples the common drains of the transistors PD1, PU1 together and a second first level contact Contact-1 couples the common drains of transistors PU2, PD2 together at node DNB. The voltage nodes are shown at the sources of the transistors as before, as in FIG. 5. The cell performs the circuit operations of an SRAM cell as for example the cell shown in FIG. 1. The SRAM cell 61 has an X-pitch and a Y-pitch as before.

Again the first level contacts at layer Contact-1 are arranged lengthwise in parallel to the gate routing direction or X direction. The first level contacts 41 and 43 at the data nodes DN and DNB are lengthened as described above, and are about 2.5 times longer than they are wide. The first level contacts at nodes CVssN1, and CVssN2, are also lengthened compared to other first level contacts, and are about 3 times as long as they are wide.

Figure 9:
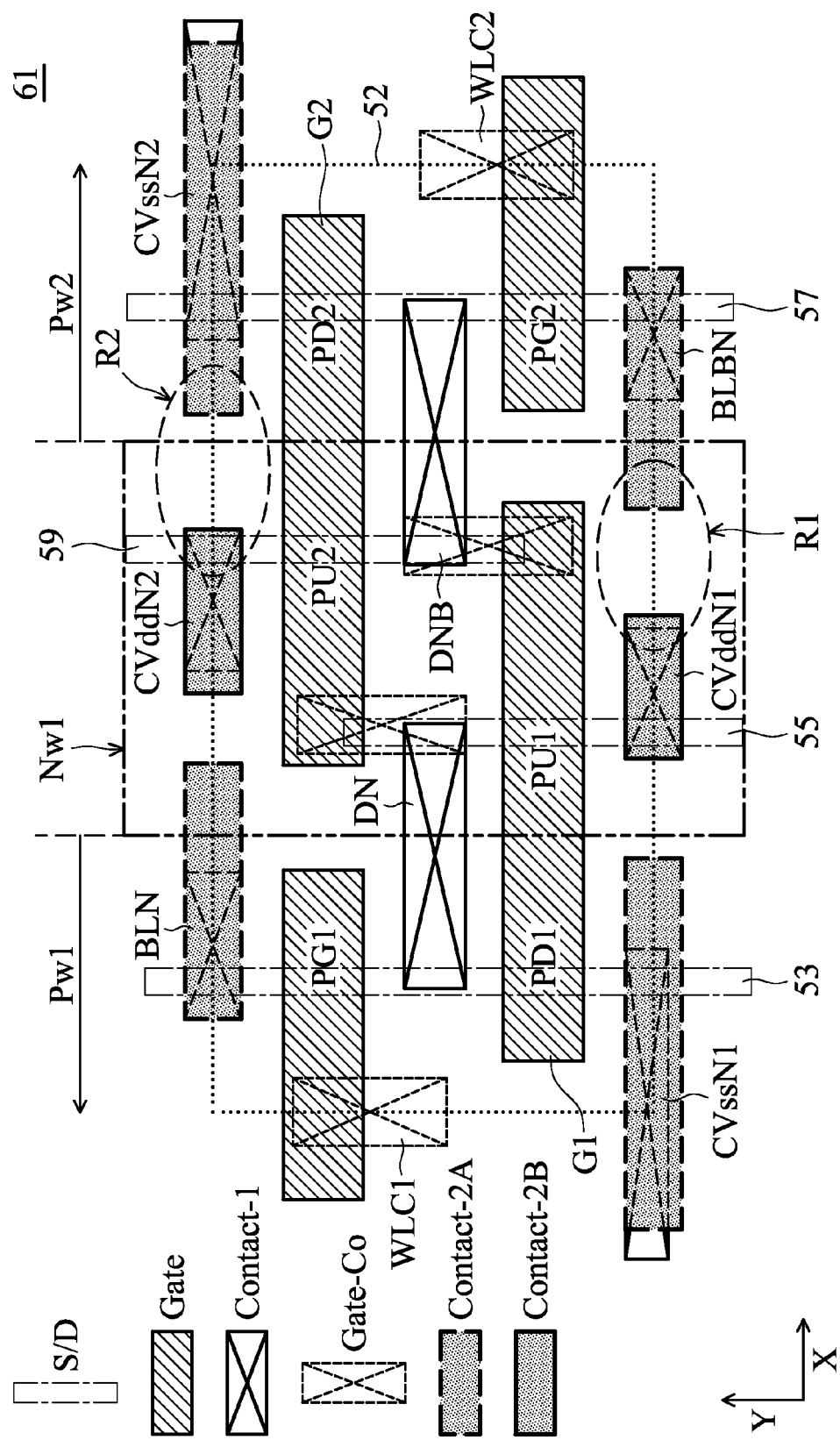
FIG. 9 illustrates in a plan view additional details of the layout of the embodiment of FIG. 8.

FIG. 9 illustrates the layout structure of the SRAM cell embodiment 61 of FIG. 8 and includes, in addition, the second layer contact structures. In FIG. 9, the contacts at the bit line node BLN, and the bit line bar node BLBN, and the Vss contact nodes CVssN1, and CVssN2, are formed of the single step patterning layer labeled Contact-2A, as before. Also, and as before, the gate contact layer Gate-CO is used to form the word line contacts WLC1 and WLC2 to the gates of the pass gates PG1, and PG2. Further, the gate contact layer Gate-CO is again used to form the butted contacts at node DN between the first layer contact and the gate G2, and at node DNB, between the first layer contact and the gate G1, and including the drain regions. The gate contacts are also arranged in the Y direction, while the first and second level contacts are all arranged in the X direction of the cell, in parallel with the gate routing direction.

In FIG. 9, at least the second level contacts used for the VDD nodes CVddN2, and CVddN1, are now formed using the two level patterning methods, and are shown as type Contact-2B. These contacts are now able to be formed with much more aggressive design rules. For an example process, such as a 28 nanometer process, the features can now be spaced by the lithographic spacing between successive patterns, about 10-20 nanometers, instead of the much larger spacing needed for single patterning, about 80 nanometers. Thus the line end rule used when the second level contacts at nodes CVddN2 and CVddN1 are formed using the two level patterning lithographic process can be much smaller, which enables space within the SRAM cell 61 for a special routing function, or allows for a smaller cell size and increased density. The areas labeled R1 and R2 in FIG. 9 illustrate the line end portions that may be pushed closer together using design rules that include the multiple patterning photolithography for the second level contact, which is labeled Contact-2B in the key shown in FIG. 9. The advantages come at a cost of additional photomasks, added processing steps and lowered throughput, but use of the multiple patterning allows the cells to be formed with aggressive design rules. The remaining second level contacts at nodes BLN, BLBN, CVssN2, CVssN1, may also be formed using multiple patterning, once the multiple patterning for the second level contacts is used.

Figure 10:
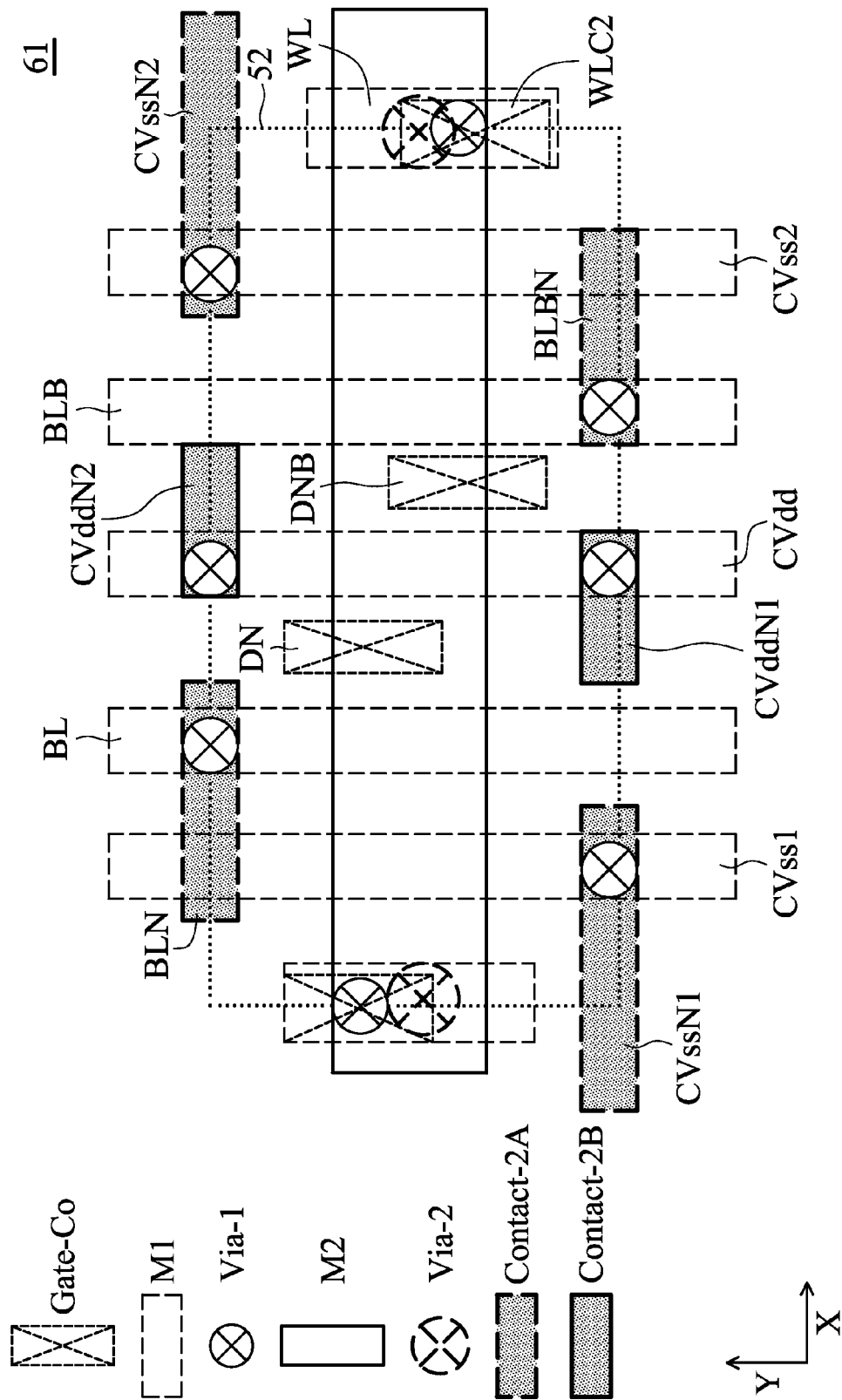
FIG. 10 illustrates in a plan view the metallization layers and via connections of the layout of the embodiment of FIGS. 8 and 9.

FIG. 10 illustrates in a plan view the metallization layers for the first and second metal layers and the vias needed to complete the layout for the SRAM cell embodiment 61 of FIG. 9. In FIG. 10, the gate contact layer Gate-CO and the second level contacts Contact-2A and Contact-2B are repeated from FIG. 9 so as to make the illustrations easy to comprehend. By superimposing the features of FIG. 10 on the layers shown in FIG. 9, the layout of SRAM cell 61 is completely shown.

As seen in FIG. 10, the bit line conductors BL and BLB, and the voltage supply conductors CVss1, CVss2, and CVdd, are shown formed in Y direction in the first metal layer M1, and may be formed of parallel M1 strips. By forming the bit line conductors BL and BLB in M1, the loading capacitance on the bit lines BL, BLB is reduced when compared to other layouts that form the bit lines in a second metal layer, M2. The lowered capacitance results because coupling the M1 bit lines to the pass gate conductors requires a single via at the Via-1 level, and this path is thus shorter and has less capacitance than a corresponding path that requires second metal M2 and additional vias.

The word line WL in FIG. 10 is formed in the "X" direction in the second level metal M2, and connects to the word line contacts WLC1 and WLC2, to control the pass gates PG1 and PG2 in FIG. 1, for example. The vertical connections to the M2 WL includes a Via-2 via, a first level metal M1 landing pad, a Via-1 via, a second level contact in layer Contact-2A, and a gate contact Gate-CO to the gate electrode of the pass gates PG1 and PG2.

In this embodiment SRAM cell 61, the interior of the SRAM cell is again free from vias, and gate contact Gate-CO and first layer contact Contact-1 are used within the internal portions of the SRAM cell. The second level contacts Contact-2A and Contact-2B are all at the cell boundaries. Again these contacts to the voltage supply conductors and the bit line and bit line bar conductors may be shared with adjacent SRAM cells (not shown) to increase packing density in an SRAM array.

Figure 11:
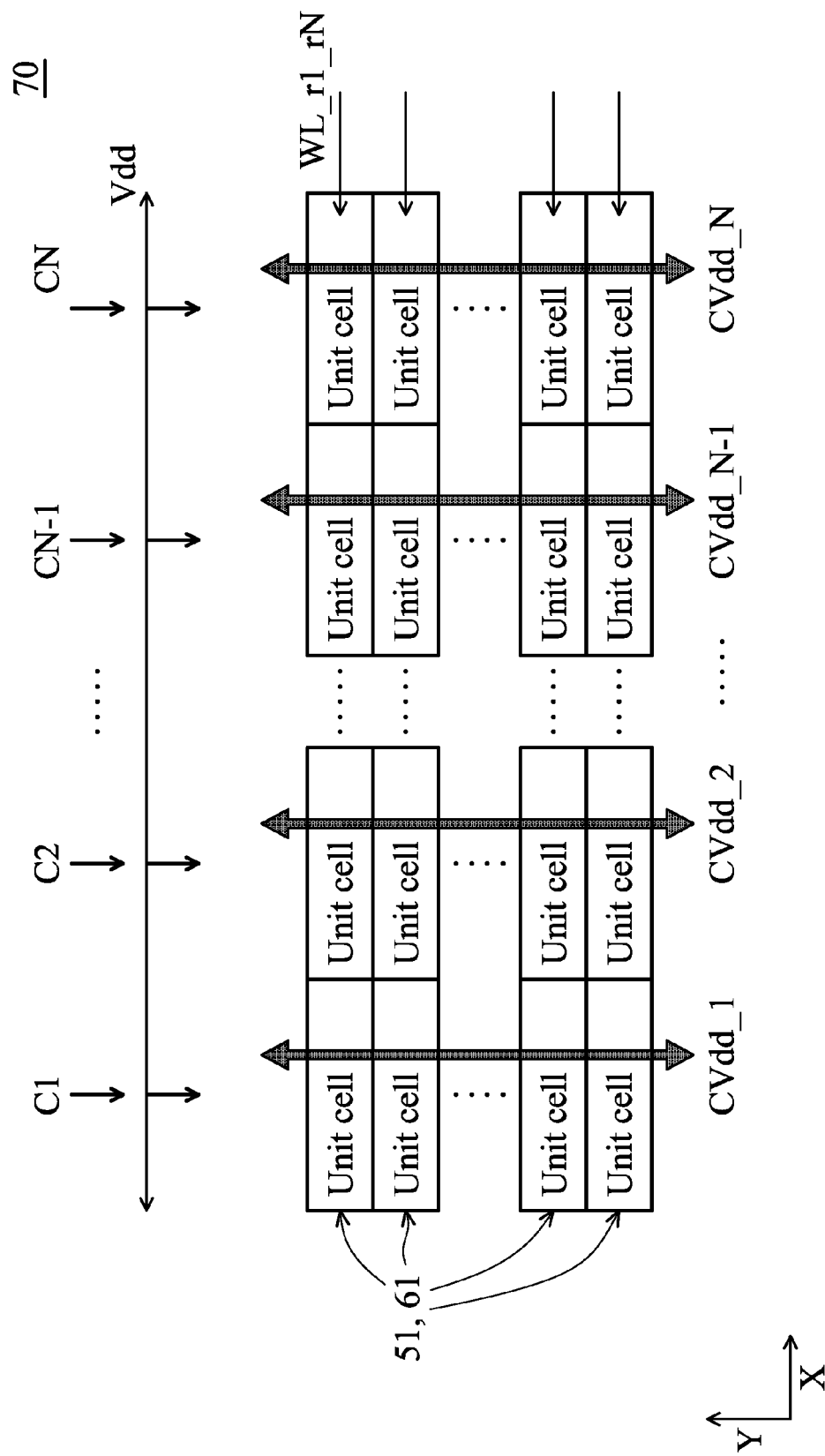
FIG. 11 illustrates in a block diagram an SRAM array on an integrated circuit for use with the embodiments.

FIG. 11 depicts in a simplified block diagram an SRAM array 70 in an integrated circuit which is formed by arranging SRAM cells 51 or 61 as described above, in rows and columns. Here columns C1-Cn are shown. Many thousands or even millions of SRAM cells may be formed in one or more SRAM arrays 70 on an integrated circuit. The SRAM arrays may be split into sub-arrays with partitioned word lines and bit lines, for example, to reduce capacitive loading and enhance circuit speeds. In some applications an SRAM integrated circuit may be formed, while more typically, the SRAM array 70 may be included in an integrated circuit with user defined logic, microprocessors, DSPs, transceivers, or other functions to form an SOC.

As shown in FIG. 7 above, the various signals and voltages needed to operate the SRAM cell may be supplied along the cell columns, or in the "Y" direction, including the bit line and bit line bar conductors BL, BLB, and conductors that supply ground and positive voltages such as CVss and CVdd. In addition the word lines may be supplied along rows or in the "X" direction as shown in the figures. As shown in FIG. 7, the column lines may be formed on a second level metal, M2, or higher; and the word lines may be formed on a first metal level, M1 for example. Straps may be used at high metal levels to provide additional current and lower resistance to supply the column conductors and row conductors with the signals.

A shown in FIG. 10, in an alternative embodiment, the bit lines BL and BLB and the supplies CVdd and CVss are again arranged in column fashion, however, these conductors are shown at the lower level metal layer, M1. The word line WL is shown at the second level metal layer, M2. By placing the bit line conductors closer to the cells and removing the bit lines from the metal 2 layer, the capacitance on the bit lines BL and BLB is reduced, which aids in increasing the read speed for the SRAM cell. During a read, the active cell on a column will place a differential data on the bit lines BL and BLB conductors. The differential signal may then be sensed by a sense amplifier. The time needed to sense the bit line data will depend on the capacitance of the bit lines, so by reducing the capacitance, better performance is attained. In FIG. 11 the SRAM array 70 may be arranged using the first metal bit lines for better performance if the layout of FIG. 10 is used for the SRAM cells 61.

Figure 12:
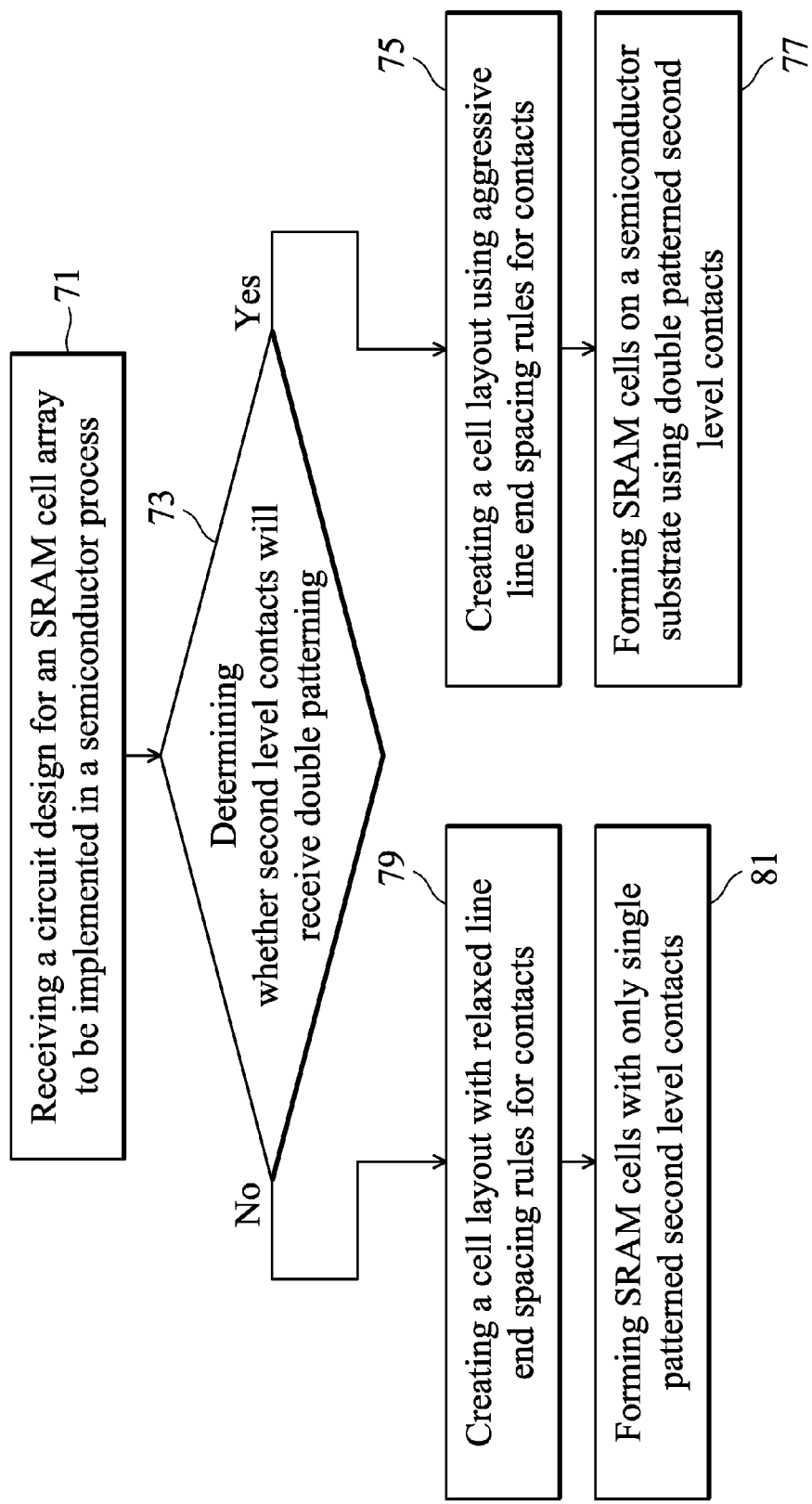
FIG. 12 illustrates in a flow diagram a method embodiment.

FIG. 12 depicts in a flow chart diagram a method embodiment. In FIG. 12, at step 71, a circuit design including SRAM cell circuits for an array to be formed in a semiconductor process is received. At step 73, a decision is made on whether to use two level photolithographic patterning for the second level contacts in the SRAM cells. This decision is based on the available photolithographic tools, the minimum feature size of the process node, and the costs associated with extra photomasks and lithography, and the SRAM cell density desired. If the decision is made to use the two level photolithography for the second level contacts, the next step in the method is shown at step 75, where the layout for the cells is formed using aggressive line end rules for the contacts. The next step 77 illustrates using the layout with the aggressive line end rules to form SRAM cells on a semiconductor substrate.

If at step 73 the decision is made not to use the two level patterning for the second level contacts in the SRAM cells, the next step 79 depicts creating a layout for the SRAM cells using relaxed line end rules that are compatible with single patterning using the particular process tools. At step 81, the SRAM cells are formed on a semiconductor substrate using the layout and performing single patterning photolithography for the second level contacts, and not performing double patterning for these contacts.

In an embodiment, an SRAM cell array structure includes a plurality of SRAM cells. Each of the SRAM cells has a structure that includes a first level contact layer and a second level contact layer. The first level contacts may be connected to the source/drain region of MOSFET transistors that form the SRAM cells. The second level contacts serve as the connection path between the first level contacts to upper level metal layers, either via or metal layers. Each of the SRAM cells has connections to a bit-line, bit-line bar, a word line, a CVdd line, and a CVss line. Each of the SRAM cells has nodes including CVdd nodes, CVss nodes, bit-line node, bit-line bar node, data node and data bar node wherein the nodes of CVdd, CVss, Bit-line and bit-line bar comprise both first level contact and second level contacts formed thereon. The nodes of data node and data node bar have first level contacts formed thereon, and no second level contacts formed thereon.

In a further embodiment SRAM structure, each of the SRAM cells described above is provided and further includes a gate contact layer that is substantially co-planar with the second level contacts. The gate contacts include rectangular shapes, ellipse shapes, or circular shapes, or may include a combination of these. The gate contacts may be connected to gate terminals of the MOSFET devices, or to a first level contact, or to a combination. Each of the SRAM cells includes at least 4 of the gate contacts (first gate contact, second gate contact, third gate contact and fourth gate contact). The first gate contact may be connected to a gate electrode of an inverter and to a first level contact at the data node. The second gate contact may be connected to the gate electrode of a second inverter and to a second first level contact at the data bar node. The third gate contact may be connected to the gate terminal of a first pass gate device. The fourth gate contact may be connected to the gate terminal of a second pass gate device.

In another embodiment, each of the SRAM cells includes two cross-coupled inverters and two pass gate devices. Each of the inverters includes at least one pull up device and one pull down device, and the inverters have common gate electrodes for both devices. Each of the transistor devices includes a drain terminal, source terminal and gate terminal. Each of the data nodes couples the drain nodes of first pull-down device and first pull-up device together, and has a first level contact formed at the nodes to electrically connect both terminals together. The data bar nodes couple the drain nodes of the second pull-down device and second pull-up device, and have a second first level contact electrically connecting both terminals together. In the SRAM cells, a CVdd node is located at the source region of the pull-up devices. A CVss node is located at the source regions of the pull-down devices. The bit line node is located at the drain region of first pass gate device. The bit line bar node is located at the drain region of second pass gate device.

In a further embodiment of the SRAM cells, the contact shape of contacts formed at the CVss node is lengthened compared to the other contacts for both the first level contact and the second level contact, and has a length-to-width ratio greater than about 3. The total length of the second level contact at the CVss node is shorter than first level contact by at least 5% of the first level contact length.

In another embodiment of an SRAM cell structure, an SRAM cell has bit line and bit line bar contacts formed for first and second level contacts. The first level contacts of the bit-line node and the bit-line bar node are substantially the same size. In an SRAM cell array embodiment having the SRAM cells, the first level contacts of the bit-line node and bit-line bar node have the shortest first level contact length when compared to other first level contacts in the SRAM cells for other nodes, including a CVdd node, a CVss node, and internal data nodes to the SRAM cells.

In another embodiment, an SRAM cell structure has at least first and second upper metal layers overlying the cell structure. In an embodiment, a first level metal layer is coupled to the cell structure by first level vias that serve as the connection path between second level contacts to the first level contacts and the first level metal layer. A word-line conductor is located at the first level metal layer and contacts the cell structure with first level vias. The SRAM cell further includes second level vias that couple to the second level metal layer. The second level vias serve as the connection path between the first level metal layer and the second level metal layer. Bit-line, bit-line bar, CVdd and CVss lines are located at the second level metal layer and couple to the SRAM cell structure using second level vias to a first metal layer conductor, first level vias between the first metal layer and a second level contact, and first level contacts between the second level contacts and active portions of the SRAM cell structure.

In another embodiment, an SRAM cell structure is provided with first and second layer metal conductors overlying the structure. First level vias serve as the connection path between second level contacts to the first metal layer. The SRAM cell includes bit-line, bit-line bar, CVdd and CVss lines located in the first metal layer. The SRAM cell future includes second level vias and conductors in the second metal layer. The second level vias serve as the connection path between portions of the first metal layer and the second metal layer. The SRAM cell includes a word-line located in the second metal layer.

An alternative embodiment includes an SRAM bit cell structure. The SRAM bit cell has a first pitch in a X direction and a second pitch in a Y direction and includes a first and a second CVss nodes for receiving a ground voltage, a first and a second CVdd node for receiving a positive supply voltage, a data node and a data bar node, a bit-line node and a bit line bar node; and a plurality of contacts formed of first level cell contacts and second level contacts. The SRAM bit cell structure includes some first level contacts that are arranged substantially following a first routing direction along the X direction and connected to the active regions of individual nodes, and a first level contact located on the first CVdd node, a first level contact located on the second CVdd node, a third first level contact located on the first CVss node, the fourth first level contact located on the second CVss node. The SRAM cell structure further includes a first level contact located upon first bit-line node. A first level contact located upon first bit-line bar node, a first level longer contact located upon the data node and a longer first level contact located upon the data bar node. In the SRAM cell structure of this embodiment, the longer contacts have a length to width ratio greater than about 2.5.

In another embodiment, the SRAM cell structure includes second level contacts located upon the first level contacts that serve as the connection path between the first contact level to an upper via hole or first metal layer, and the structure includes a first second level contact located upon a first level contact for the nodes that correspond to the CVss nodes, the CVdd nodes, the bit line node and the bit line bar node. For the first level contacts on the data node and data bar node, second level contacts are not formed on these first level contacts.

In another embodiment, the SRAM structure with the second level contacts formed on the first level contacts at the nodes including the CVdd nodes, the CVss nodes and the bit line and bit line bar nodes are all located at a cell boundary for the SRAM structure, and may be shared with adjacent SRAM bit cells.

In a further embodiment, in the SRAM structures, each cell has a circuit which includes a latch formed from two cross-coupled inverters and two pass gate devices, these are coupled to nodes for receiving a bit-line, a bit-line bar, a word line, a CVdd line and a CVss line. Each of the cross-coupled inverters further includes at least one pull up device and one pull down device, and the devices in the inverter have a common gate electrode. The first inverter has at its output the data bar node and a first level contact is coupled to the data bar node. The second inverter has at its output the data node and a first level contact is coupled to the data node. The first level contacts at the data node and data bar node are longer than the other first level contacts in the cell structure. The SRAM cell structure further includes two butted contacts that are formed over the gate electrodes and are co-planar with the second level contacts. In each cell, the first butted contact connects the gate electrode of the second inverter and the first level longer contact at the data node. The second butted contact is connected to the gate electrode of the first inverter and first level longer contact at the data node bar. The first and second butted contacts are each located upon an N-well area within the SRAM structure.

In the SRAM structure, in another alternative embodiment, a first routing direction is same as the word-line routing direction and follows the X-axis direction. For the second level contacts at the data node and the data bar node, the second level contact layout shape is a longer contact that has a length-to-width ratio larger than about 2.5, and the second level contacts are arranged substantially following said first routing direction.

In another embodiment, in the SRAM structures, the first level contacts have an aspect ratio (contact hole height to hole bottom width) that is less than about 3.

In another embodiment of the SRAM structures, the second level contacts have an aspect ratio (hole height to hole bottom width) is less than 5.

In another embodiment, an SRAM cell structure as described above includes first level vias that serve as the connection path between the second level contacts to a first metal layer; second level vias and second level metal lines overlying the SRAM cell structure. The second level vias serve as the connection path between the first level metal layer and the second level metal layer; and each cell further includes word-line, bit-line and bit-line bar signals as data input/output signal conductors; and CVss and CVdd signals for power conductor lines; wherein the word line conductor is located at the first metal layer. The bit-line, bit-line bar, CVdd and CVss lines are located at the second metal layer.

In yet another alternative embodiment, an SRAM cell structure further includes first level vias that serve as the connection path between second level contacts and a first metal layer; second level vias and second level metal lines. The second level vias serve as the connection path between the first metal layer and the second metal layer; and each cell further includes word-line, bit-line and bit-line bar as data input/output signal conductors; and CVss and CVdd for power conductor lines; wherein the bit-line, bit-line bar, CVdd and CVss lines are located at first metal layer and the word line signal is located at second level metal layer.

Another embodiment is an SRAM cell layout that includes a cell boundary and a first X-pitch, a first Y-pitch, and word-line, bit-line and bit-line bar as data input/output signal conductors; and CVss and CVdd for power conductor lines. The first X-pitch is located at X-axis direction and first Y-pitch is located at Y-axis direction. The word-line routing direction arranged along the X-axis, and bit-line and bit-line bar are arranged along the Y-axis direction.

In the above SRAM cell, contacts are formed in active areas. The contacts include a first group of contacts located at first level contact layer to serve as drain or source node connections for devices in the SRAM cell. A second group of contacts is located at second level contact layer and these serve as connection paths between first level contact layer to an upper layer via hole or a metal layer. In the SRAM cell, the first group of contacts are located at both a cell boundary and at intra cell data nodes. The second group of contacts are located at the cell boundary and shared with adjacent cells.

In a further alternative embodiment, the SRAM cells include two cross-coupled inverters and two pass gate devices. Each of the inverters includes at least one pull up device and one pull down device, and a common gate electrode for both devices. Each of these devices includes a drain terminal, source terminal and gate terminal. A data node for the SRAM cell include the drain nodes of first pull-down device and first pull-up device, and a first contact of the first group of contacts electrically connects both drain terminals together. A data bar node includes the drain nodes of a second inverter formed of a second pull-down device and second pull-up device, and a second one of the first group of contacts electrically connects both terminals together. The CVdd node is located at the source region of the pull-up devices. The CVss node is located at the source region of the pull-down devices. The bit line node is located at the drain region of a first pass gate device. The bit line bar node is located at the drain region of a second pass gate device.

In yet another embodiment of the SRAM cells, each SRAM cell includes a third group contacts that is formed substantially co-planar with the second group of contacts. The shapes of the third group of contacts include rectangular, ellipse, circular or combinations. The third group contacts are connected to gate terminal of the devices, or to a first group contact, or a combination. In an embodiment, an SRAM cell may include at least four third group contacts. A first third group contact is connected to both the gate electrode of the second inverter and to a first group contact at the data node. The second third group contact is connected to both the gate electrode of first inverter and to a first group contact at the data bar node. The third third group contact is connected to the gate terminal of first pass gate device. The fourth third group contact is connected to the gate terminal of the second pass gate device.

In an embodiment, the manufacturing processes for the first group contacts in the above described SRAM structures include at least a two pattern lithography process having first lithography for the first level contacts formed at the CVdd nodes, bit line and bit line bar node and CVss nodes; and including a second lithography process for the first level contacts formed at the data node and data bar node.

In another embodiment, for the SRAM structures described above, the manufacturing process of the second group contacts includes at least a two pattern photolithography process. The second group contacts formed at two adjacent CVdd nodes and CVss nodes are formed by two different lithography steps.

In another embodiment, an apparatus is provided that includes at least one SRAM cell formed in a portion of a semiconductor substrate, including: a first inverter having at its output a data node, the first inverter further comprising a first pull up device coupled between a first positive supply CVdd node and the data node, and a first pull down device coupled between a first ground supply CVss node and the data node, and a common gate electrode of the first pull-up and first pull-down devices coupled to a data bar node; a second inverter having at its output the data bar node, the second inverter further comprising a second pull up device coupled between a second positive supply CVdd node and the data bar node, and a second pull down device coupled between a second ground supply CVss node and the data bar node, and a common gate electrode of the second pull-up and second pull-down devices coupled to the data node; a first pass gate coupled between a bit line node and the data node; a second pass gate coupled between a bit line bar node and the data bar node; first level contacts formed at the first and second CVdd nodes, the first and second CVss nodes, the bit line node, the bit line bar node, the data node and the data bar node; and second level contacts formed on each of the first level contacts at the first and second CVdd nodes, the first and second CVss nodes, the bit line node and the bit line bar node; wherein the first level contacts formed at the data node and the data bar node do not have a second level contact formed thereon.

In another embodiment, a layout is provided with an SRAM structure, including a cell formed on a semiconductor substrate having a cell boundary and having an X-pitch in an X direction and a Y-pitch in a Y direction, the cell including a first group of first level contacts coupled to active regions of devices including contacts formed on a first CVdd node at the source of a first pull-up device of a first inverter, formed on a first CVss node at the source of a first pull-down device in the first inverter, formed on a second CVdd node at the source of a second pull-up device in a second inverter, formed on a second CVss at the source of a second pull-down device in the second inverter, formed at a bit line node at the source of a first pass gate, formed at a bit line bar node at the source of a second pass gate, wherein each of these first group of first level contacts is formed at the cell boundary and having a length arranged in the X direction, and each of these first level contacts is shared with an adjacent SRAM cell; a second group of first level contacts including contacts formed at the data node on a common drain of the first pass gate and the first pull-down device and coupling the data node to a drain of the first pull-up device, and a contact formed at the data bar node and coupling a common drain of the second pass gate and the second pull-down device to a drain of the second pull-up device, the second group of first level contacts arranged with a length in the X direction and having a length-to-width ratio that is greater than about 2.5; and a first group of second level contacts formed on the first group of first level contacts and coupling the first level contacts to an overlying first level via, the first group of second level contacts being arranged with a length in the X direction and disposed at the cell boundary and shared with adjacent SRAM cells.

In another embodiment, a method is provided that includes receiving an SRAM circuit design for forming an array of SRAM cells on a semiconductor substrate; determining whether a two layer photolithography process for second level contacts is to be used in the SRAM cells; based on the determining, selecting a cell layout including a two layer second level contacts or selecting a cell layout with single layer second level contacts for the SRAM cells; and forming the array of SRAM cells on the semiconductor substrate.

Although exemplary embodiments of the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. An apparatus, comprising:
   at least one SRAM cell formed in a portion of a semiconductor substrate, comprising:
   a first inverter having at its output a data node, the first inverter further comprising a first pull up device coupled between a first positive supply CVdd node and the data node, and a first pull down device coupled between a first ground supply CVss node and the data node, and a common gate electrode of the first pull-up and first pull-down devices coupled to a data bar node;
   a second inverter having at its output the data bar node, the second inverter further comprising a second pull up device coupled between a second positive supply CVdd node and the data bar node, and a second pull down device coupled between a second ground supply CVss node and the data bar node, and a common gate electrode of the second pull-up and second pull-down devices coupled to the data node;
   a first pass gate coupled between a bit line node and the data node;
   a second pass gate coupled between a bit line bar node and the data bar node;
   first level contacts formed at the first and second CVdd nodes, the first and second CVss nodes, the bit line node, the bit line bar node, the data node and the data bar node; and
   second level contacts formed on each of the first level contacts at the first and second CVdd nodes, the first and second CVss nodes, the bit line node and the bit line bar node;

wherein the first level contacts formed at the data node and the data bar node do not have a second level contact formed thereon.

2. The apparatus of claim 1, wherein the at least one SRAM cell has a cell boundary, and the first level contacts for the first and second CVss nodes, the first and second CVdd nodes, and the bit line and bit line bar nodes, are arranged along the cell boundary.

3. The apparatus of claim 2, wherein the second level contacts formed on the first level contacts for the for the first and second CVss nodes, the first and second CVdd nodes, and the bit line and bit line bar nodes, are formed along the cell boundary.

4. The apparatus of claim 1, and further comprising gate contacts formed substantially coplanar with the second level contacts, the gate contacts formed coupling the first level contact at the data node to the common gate electrode of the first inverter, coupling the first level contact at the data bar node to the common gate electrode of the second inverter, and formed at the gates of the first and second pass gates.

5. The apparatus of claim 4, wherein the gate contacts formed at the data node and the data bar node are butted contacts.

6. The apparatus of claim 4 wherein the gate contacts have shapes selected from the group consisting essentially of circular, rectangular, elliptical, and combinations.

7. The apparatus of claim 4, and further comprising:
a first metal layer overlying the at least one SRAM cell and forming a word line coupled to gate terminals of the first and second pass gates using first level vias and gate contacts; and
a second metal layer overlying the at least one SRAM cell and forming conductors for a bit line, a bit line bar, a positive supply voltage CVdd, and a ground supply voltage CVss, and each coupled to the corresponding nodes including the bit line node, the bit line bar node, the first and second CVdd nodes, and the first and second CVss nodes by second level vias, portions of the first metal layer, and first metal vias coupled to the second level contacts.

8. The apparatus of claim 4, and further comprising:
a first metal layer overlying the at least one SRAM cell and forming conductors for a bit line, a bit line bar, a positive supply voltage CVdd, and a ground supply voltage CVss, and each of the conductors in the first metal layer coupled to the corresponding nodes including the bit line node, the bit line bar node, the first and second CVdd nodes, and the first and second CVss nodes by first level vias to the second level contacts formed on the first level contacts; and
a second metal layer overlying the SRAM cell and forming a conductor for a word line, the second metal layer word line coupled to second level vias, portions of the first metal layer, and first metal vias coupled to the gate contacts for the first and second pass gates.

9. The apparatus of claim 1, wherein the first level contacts at the data node and the data bar node have a length to width ratio that is greater than about 2.5.

10. The apparatus of claim 1, wherein the first level contacts at the first and second CVss nodes have a length to width ratio that is greater than about 3.

11. The apparatus of claim 1, wherein the second level contacts are formed using two levels of photolithography.

12. The apparatus of claim 1, wherein the first level contacts at the bit line and bit line bar node have a length to width ratio that is less than the length to width ratio of any of the remaining first level contacts in the at least one SRAM cell.

13. An SRAM structure, comprising:
a cell formed on a semiconductor substrate having a cell boundary and having an X-pitch in an X direction and a Y-pitch in a Y direction, the cell comprising:
a first group of first level contacts coupled to active regions of devices including first level contacts formed on a first CVdd node at a source of a first pull-up device of a first inverter, formed on a first CVss node at a source of a first pull-down device in the first inverter, formed on a second CVdd node at a source of a second pull-up device in a second inverter, formed on a second CVss at a source of a second pull-down device in the second inverter, formed at a bit line node at a source of a first pass gate, formed at a bit line bar node at a source of a second pass gate, wherein each of these first group of first level contacts is formed at the cell boundary and each first level contact having a length arranged in the X direction, and at least one of these first level contacts is shared with an adjacent SRAM cell;
a second group of first level contacts including contacts formed at a data node at a common drain of the first pass gate and the first pull-down device and coupling the data node to a drain of the first pull-up device, and a contact formed at a data bar node and coupling a common drain of the second pass gate and the second pull-down device to a drain of the second pull-up device, the second group of first level contacts arranged with a length in the X direction and having a length-to-width ratio that is greater than about 2.5; and
a first group of second level contacts formed on the first group of first level contacts and coupling the first level contacts to an overlying first level via, the first group of second level contacts being arranged with a length in the X direction and disposed at the cell boundary and at least one of the first group of second level contacts shared with an adjacent SRAM cell.

14. The SRAM structure of claim 13, wherein the second group of first level contacts does not have a second level contact formed thereon.

15. The SRAM structure of claim 13, wherein the first and second group of first level contacts each comprise a contact hole with an aspect ratio of hole height to hole width that is less than about 3.

16. The SRAM structure of claim 13 wherein the first group of second level contacts each comprise a contact hole with an aspect ratio of hole height to hole width that is less than about 5.

17. The apparatus of claim 1, further comprising a first fin structure and a second fin structure and wherein the first pull up device is formed at least partially in the first fin structure and the first pull down device is formed at least partially in the second fin structure and a first common gate structure extends over the first fin structure and the fin structure.

18. The apparatus of claim 17, wherein the first pass gate is formed at least partially in the first fin structure.

19. The apparatus of claim 13, wherein the first pull-down device includes a first source region and a first common drain region in a first fin structure and the first pass gate includes a second source region and the first common drain region in the first fin structure.

20. The apparatus of claim 13, wherein the cell includes four structures extending in a first direction and four gate structures extending in a second direction normal to the first direction.

* * * * *